(12) United States Patent
Stoeger et al.

(10) Patent No.: US 10,426,004 B2
(45) Date of Patent: Sep. 24, 2019

(54) DRIVER CIRCUIT FOR A LIGHT-EMITTING DIODE ARRANGEMENT, LIGHTING APPARATUS AND MOTOR VEHICLE

(71) Applicant: CONTINENTAL AUTOMOTIVE GMBH, Hannover (DE)

(72) Inventors: Christian Stoeger, Vienna (AT); Emil Kovatchev, Vienna (AT)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 16/101,698

(22) Filed: Aug. 13, 2018

(65) Prior Publication Data
US 2019/0053341 A1   Feb. 14, 2019

(30) Foreign Application Priority Data
Aug. 11, 2017   (DE) .................. 10 2017 214 056

(51) Int. Cl.
| H05B 37/02 | (2006.01) |
| H05B 33/08 | (2006.01) |
| B60Q 1/26 | (2006.01) |
| H01L 33/36 | (2010.01) |
| B60Q 1/10 | (2006.01) |

(52) U.S. Cl.
CPC .......... *H05B 33/0815* (2013.01); *B60Q 1/10* (2013.01); *B60Q 1/2696* (2013.01); *H01L 33/36* (2013.01); *H05B 33/0845* (2013.01)

(58) Field of Classification Search
CPC .......................... H05B 37/02; H05B 33/0815; H05B 33/0845; B60Q 1/2696; B60Q 1/00; H01L 33/36; H02M 3/156
See application file for complete search history.

(56) References Cited

U.S. PATENT DOCUMENTS

| 5,814,976 A | 9/1998 | Allison | |
| 7,265,524 B2 | 9/2007 | Jordan et al. | |
| 2010/0026208 A1* | 2/2010 | Shteynberg | H05B 33/0815 315/297 |
| 2011/0089915 A1 | 4/2011 | Qiu et al. | |
| 2014/0300274 A1* | 10/2014 | Acatrinei | H05B 33/0815 315/85 |

FOREIGN PATENT DOCUMENTS

| DE | 69616937 T2 | 10/1995 |
| DE | 102008025748 A1 | 12/2009 |

* cited by examiner

*Primary Examiner* — Wei (Victor) Chan
*Assistant Examiner* — Henry Luong
(74) *Attorney, Agent, or Firm* — Laurence A. Greenberg; Werner H. Stemer; Ralph E. Locher (57) ABSTRACT

A driver circuit for a light-emitting diode arrangement has a supply terminal for connecting a voltage source. A boost converter inductance connects the supply terminal to a common circuit node. A switching unit connects the circuit node to ground depending on a switching signal. A rectifying unit connects the circuit node to an anode terminal for the light-emitting diode arrangement by way of a circuit branch to which a terminal of a storage capacitance and a terminal of an RC element are connected. A cathode terminal for the cathode side of the light-emitting diode arrangement is electrically connected to the circuit node. A buck converter inductance is connected in each case between the rectifying unit and the anode terminal and/or between the cathode terminal and the circuit node.

11 Claims, 9 Drawing Sheets

DRIVER CIRCUIT FOR A LIGHT-EMITTING DIODE ARRANGEMENT, LIGHTING APPARATUS AND MOTOR VEHICLE

CROSS-REFERENCE TO RELATED APPLICATION

This application claims the priority, under 35 U.S.C. § 119, of German patent application DE 10 2017 214 056.9, filed Aug. 11, 2017; the prior application is herewith incorporated by reference in its entirety.

BACKGROUND OF THE INVENTION

Field of the Invention

The invention relates to a driver circuit for a light-emitting diode arrangement. A light-emitting diode arrangement of this kind can have, for example, a series circuit composed of a plurality of light-emitting diodes. The driver circuit can be connected to a voltage source by means of a supply terminal and has a boost converter inductance in order to convert an input voltage from the voltage source to a higher voltage level for the light-emitting diode arrangement. The invention also includes a lighting apparatus comprising the driver circuit and a motor vehicle comprising the lighting apparatus according to the invention.

A light-emitting diode arrangement can be used for lighting purposes. This applies both to building lighting (for example as a replacement for incandescent bulbs) and to automotive technology. A light-emitting diode arrangement of this kind is typically actuated using a controlled constant current, that is to say an electric direct current, the current intensity of which is controlled to a constant value by means of a controller device or is at least kept in a predetermined value range. This has proved to be particularly advantageous for a light-emitting diode arrangement comprising a series circuit composed of light-emitting diodes.

However, there is the problem here that, for reusability, the driver circuit should be able to actuate light-emitting diode arrangements with a different number of series-connected light-emitting diodes. An example of this is the typical requirement of a driver circuit in a motor vehicle, which driver circuit is intended to be capable of driving a light-emitting diode arrangement with one light-emitting diode up to 14 series-connected light-emitting diodes. This is intended to be possible for a supply voltage or input voltage of 9 V to 16 V, sometimes even 6 V to 20 V.

In this case, in order to be able to drive the constant current as a diode current through the light-emitting diode arrangement, the output voltage at the light-emitting diode arrangement has to be able to be varied accordingly. In this case, it may be that the output voltage has to be sometimes greater and sometimes lower than the input voltage.

For the conversion of the input voltage, an inductive DC/DC converter can be used in the driver circuit, wherein a converter topology of a buck converter or boost converter does not, however, meet the electrical requirement that the output voltage is intended to be either greater than or lower than the input voltage.

United States patent application publication US 2011/0089915 A1 discloses a combined buck-boost converter, which also comprises hysteretic control for controlling a current intensity in order to provide a constant current for a light-emitting diode arrangement, for example. For the alternating boost conversion and buck conversion, however, a complex H-bridge circuit is required in order to be able to utilize an electrical coil both for the boost conversion and for the buck conversion.

A buck-boost converter is also known from U.S. Pat. No. 7,265,524 B2. A complex H-bridge circuit is also provided in that case.

SUMMARY OF THE INVENTION

It is accordingly an object of the invention to provide a driver circuit which overcomes the above-mentioned and other disadvantages of the heretofore-known devices and methods of this general type and which provides for a driver circuit for controlling a diode current of a light-emitting diode arrangement, wherein both boost conversion and buck conversion are rendered possible with respect to the available input voltage.

With the foregoing and other objects in view there is provided, in accordance with the invention, a driver circuit for a light-emitting diode arrangement, the driver circuit comprising:

a supply terminal for connecting a voltage source;
a boost converter inductance connecting the supply terminal to a common circuit node;
a switching unit configured to connect the circuit node to a ground potential depending on a switching signal;
an anode terminal for connection of an anode side of the light-emitting diode arrangement;
a rectifying unit connecting the circuit node to the anode terminal, the rectifying unit being connected to the anode terminal by way of a circuit branch to which a terminal of a storage capacitance and a terminal of an RC element are connected;
a cathode terminal for the connection of a cathode side of the light-emitting diode arrangement, the cathode terminal being electrically connected to the circuit node; and a buck converter inductance connected between the rectifying unit and the anode terminal and/or between the cathode terminal and the circuit node.

In other words, the invention provides a driver circuit for a light-emitting diode arrangement. The driver circuit can be provided, for example, as a constituent part of a control device for the light-emitting diode arrangement. The light-emitting diode arrangement can have, for example, a single light-emitting diode or a series circuit composed of a plurality of light-emitting diodes. The light-emitting diode arrangement can be operated or supplied with power using a diode current from the driver circuit. When the diode current is flowing, the at least one light-emitting diode of the light-emitting diode arrangement is on. In the driver circuit, for the connection of the light-emitting diode arrangement, there is provision for an anode side of the light-emitting diode arrangement to be electrically connected to an anode terminal of the driver circuit and for a cathode side of the light-emitting diode arrangement to be electrically connected to a cathode terminal of the driver circuit. A "terminal" is in this case an electrical contact or an electrode. The anode side and the cathode side are produced by the corresponding designations on the light-emitting diodes of the light-emitting diode arrangement themselves.

In order to connect the driver circuit to a voltage source for the purpose of energy supply, a supply terminal is provided. An input voltage, which is, in particular, a DC voltage, can be received from the voltage source by means of the supply terminal. The input voltage can be connected, that is to say the lighting operation of the light-emitting diode arrangement is also interrupted or terminated by disconnection of the input voltage.

In the driver circuit, the supply terminal is connected to a central or common circuit node by means of a boost converter inductance. The boost converter inductance can be realized by an electrical inductor or coil. In connection with the invention, a circuit node is a node or a line section by means of which a plurality of electrical components of the driver circuit are electrically connected. The circuit node accordingly also connects a switching unit to a ground potential of the driver circuit. The switching unit is configured to electrically connect (short) the circuit node to the ground potential depending on a switching signal. The circuit node is thus either electrically connected to or isolated from the ground potential depending on the present value of the switching signal. The switching unit can be implemented, for example, on the basis of a transistor, in particular a field-effect transistor. A rectifying unit is also connected to the circuit node. The rectifying unit connects the circuit node to the anode terminal of the driver circuit. The rectifying unit can be formed on the basis of a diode. The forward direction is then oriented from the circuit node to the anode terminal.

The rectifying unit is connected to the anode terminal by means of a circuit branch to which a terminal of a storage capacitance is connected. In other words, the storage capacitance can be charged with energy from the voltage source by means of the boost converter inductance and the rectifying unit. While the switching unit is electrically turned on and hence the circuit node is shorted to the ground potential, the diode current of the light-emitting diode arrangement can then advantageously be operated by means of the storage capacitance. The storage capacitance can be formed on the basis of a capacitor or a plurality of capacitors.

This design or this construction of the driver circuit corresponds to a boost converter section. In a conventional boost converter, the cathode terminal would now be connected simply to said ground potential for the connection of the cathode side of the light-emitting diode arrangement. However, the invention now additionally provides the function of a buck converter by virtue of there instead being provision for the cathode terminal of the driver circuit to likewise be electrically connected to the circuit node. However, the electrical connection does not have to be direct but it can be guided or provided by means of at least one electrical component. In one configuration, namely, a buck converter inductance is connected between the cathode terminal and the circuit node for the buck conversion. The cathode terminal is then accordingly connected to the circuit node by means of the buck converter inductance. In addition or alternatively, in a further configuration, a buck converter inductance can be connected between the rectifying unit and the anode terminal. The two possible interconnection locations for a buck converter inductance result from the fact that the interconnection of the buck converter inductance upstream of the anode terminal and downstream of the cathode terminal is equivalent on account of current conservation (Kirchhoff's first law). The buck converter inductance can be realized by an electrical inductor or coil.

Instead of an individual inductance comprising an elaborate H-bridge circuit, the invention thus utilizes two inductances, namely a boost converter inductance and a buck converter inductance. As a result thereof, the need for switching units can advantageously be reduced to one said switching unit, by means of which the circuit node can be connected to the ground potential. The control process can also accordingly be realized in a simple manner. The component outlay is thus advantageously low.

A terminal of an RC element is also connected to the circuit branch by means of which the rectifying unit is connected to the anode terminal. In other words, the rectifying unit is connected to the anode terminal by means of a circuit branch to which a terminal of a storage capacitance and a terminal of an RC element are connected. An RC element of this kind can be formed on the basis of a series circuit of an ohmic resistance element and a capacitor. The RC element can be connected in parallel with said storage capacitor. Damping can be brought about by means of the RC element in order to damp resonant behavior, as can result due to the boost converter inductance, the storage capacitance and an input capacitance at the supply terminal.

The invention also comprises further configurations, which each produce an additional technical advantage.

According to one configuration, the cathode terminal is connected to the ground potential exclusively by way of the circuit node and the switching unit, that is to say there is no other current path to the ground potential. This produces the advantage that the diode current flowing between the anode terminal and the cathode terminal cannot drain off unswitched to the ground potential.

One configuration makes provision for the anode terminal and the cathode terminal to be connected by means of a smoothing capacitance. As a result thereof, a ripple of the diode current of the light-emitting diode arrangement can advantageously be reduced compared to a ripple of the current flowing through the buck converter inductance. The smoothing capacitance can be formed by means of a capacitor or a plurality of capacitors.

A further configuration makes provision for a hysteretic controller device to be provided for generating the switching signal, by means of which the switching unit is switched. Another name for hysteretic control is also bang-bang control. Said controller is configured to switch the switching unit by means of a switching signal and in this case to keep a current intensity of the current flowing from the cathode terminal to the circuit node between a predetermined minimum value and a predetermined maximum value. The minimum value is in this case lower than the maximum value.

In order to determine the present current intensity of the current to be controlled, one configuration makes provision for the cathode terminal to be connected to the circuit node by means of a current measurement unit, which is designed to generate a measurement signal correlated with the current intensity. As a result thereof, the current intensity is advantageously determined directly in the relevant circuit branch.

To generate the measurement signal, one configuration makes provision for the cathode terminal to be electrically connected to the circuit node by means of a shunt resistor of the current measurement unit. This produces the advantage that the measurement of the current intensity is so precise that light-emitting diodes of the light-emitting diode arrangement are protected against damage caused by overcurrent.

In order to then satisfy said minimum value and said maximum value, one configuration makes provision for a first comparator unit to be configured to compare said measurement signal of the current measurement unit with a first reference signal and to signal a result of the comparison as a first comparison signal. A second comparator unit is also configured to compare the measurement signal with a second reference signal and to signal the result of the comparison as a second comparison signal. A flip-flop unit is configured to receive the first comparison signal of the comparison signals at a set input and the second comparison signal of the comparison signals at a reset input. The switching signal is then generated at an output of the flip-flop unit. The switching signal is in this case set to a switch-on value when the current intensity is lower than the minimum value set by the first reference signal and the switching signal is set to a switch-off value when the current intensity is greater than the maximum value set by the second reference signal. The switch-on value electrically switches the switching unit on, the switch-off value electrically switches the switching unit off. A comparator unit can be formed on the basis of an operational amplifier in the comparator circuit. The controller device can advantageously be realized with very low complexity The rectifying unit can be formed on the basis of at least one diode in said manner. As an alternative thereto, there can be provision for an additional switching unit to be provided in the rectifying unit, which additional switching unit is referred to here as a rectifying switching unit. Said rectifying switching unit has the advantage of a lower forward resistance compared to a diode. The rectifying switching unit can be formed on the basis of a transistor, in particular a field-effect transistor.

In order to switch the rectifying switching unit with low complexity, one configuration makes provision for an inverting device to be provided for the rectifying switching unit, which inverting device is configured to switch the rectifying switching unit inversely to the switching unit, which connects the circuit node to the ground potential. It is then always either this switching unit or the rectifying switching unit that is electrically switched on, but never both at the same time. The inverting device can be formed on the basis of a logic gate. Said inverting device can be provided by the inverting output of said flip-flop unit.

One configuration also makes a dimming function possible for the light-emitting diode arrangement. To this end, a dimming terminal is provided for receiving a dimming signal. Furthermore, a dimming switching unit is connected upstream of the anode terminal or a dimming switching unit is connected downstream of the cathode terminal. The dimming switching unit is configured to block the diode current flowing between the anode terminal and the cathode terminal depending on the dimming signal. The dimming signal can be, for example, a pulse-width-modulated signal, that is to say can depend on a pulse-width modulation (PWM). The dimming switching unit is connected in series with the light-emitting diode arrangement itself by way of the described arrangement of said dimming switching unit. Said dimming switching unit can thus reliably or directly fully interrupt the diode current or let the diode current pass. This advantageously ensures steep switching edges, as a result of which a contrast ratio is maximized. The dimming switching unit can be formed on the basis of a transistor, in particular a field-effect transistor.

The invention also includes the combination of the driver circuit and a light-emitting diode arrangement. The resulting lighting apparatus makes provision for the anode side of the light-emitting diode apparatus to be connected to the anode terminal of the driver circuit and the cathode side of the light-emitting diode apparatus to be connected to the cathode terminal of the driver circuit. The lighting apparatus can be designed, for example, as a headlight for a motor vehicle or as a lighting source for a building lamp or for a motor vehicle interior or a motor vehicle signal lamp.

In connection with the use of the invention in a motor vehicle, the invention also makes provision for a motor vehicle comprising one embodiment of the lighting apparatus according to the invention, wherein the motor vehicle is configured to provide an input voltage between the supply terminal and a ground terminal of the driver circuit of the lighting apparatus by means of a voltage source. The motor vehicle according to the invention can be, for example, a passenger car or a commercial vehicle.

Further features of the invention emerge from the claims, the figures and the description of the figures. The features and combinations of features mentioned above in the description and the features and combinations of features mentioned in the description of the figures below and/or shown in the figures alone can be used not only in the respectively stated combination, but also in other combinations or alone.

Other features which are considered as characteristic for the invention are set forth in the appended claims.

Although the invention is illustrated and described herein as embodied in a driver circuit for a light-emitting diode arrangement and lighting apparatus and motor vehicle, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

In the figures, the same reference numerals are used in each case for elements having the same function.

DETAILED DESCRIPTION OF THE INVENTION

Figure 1:
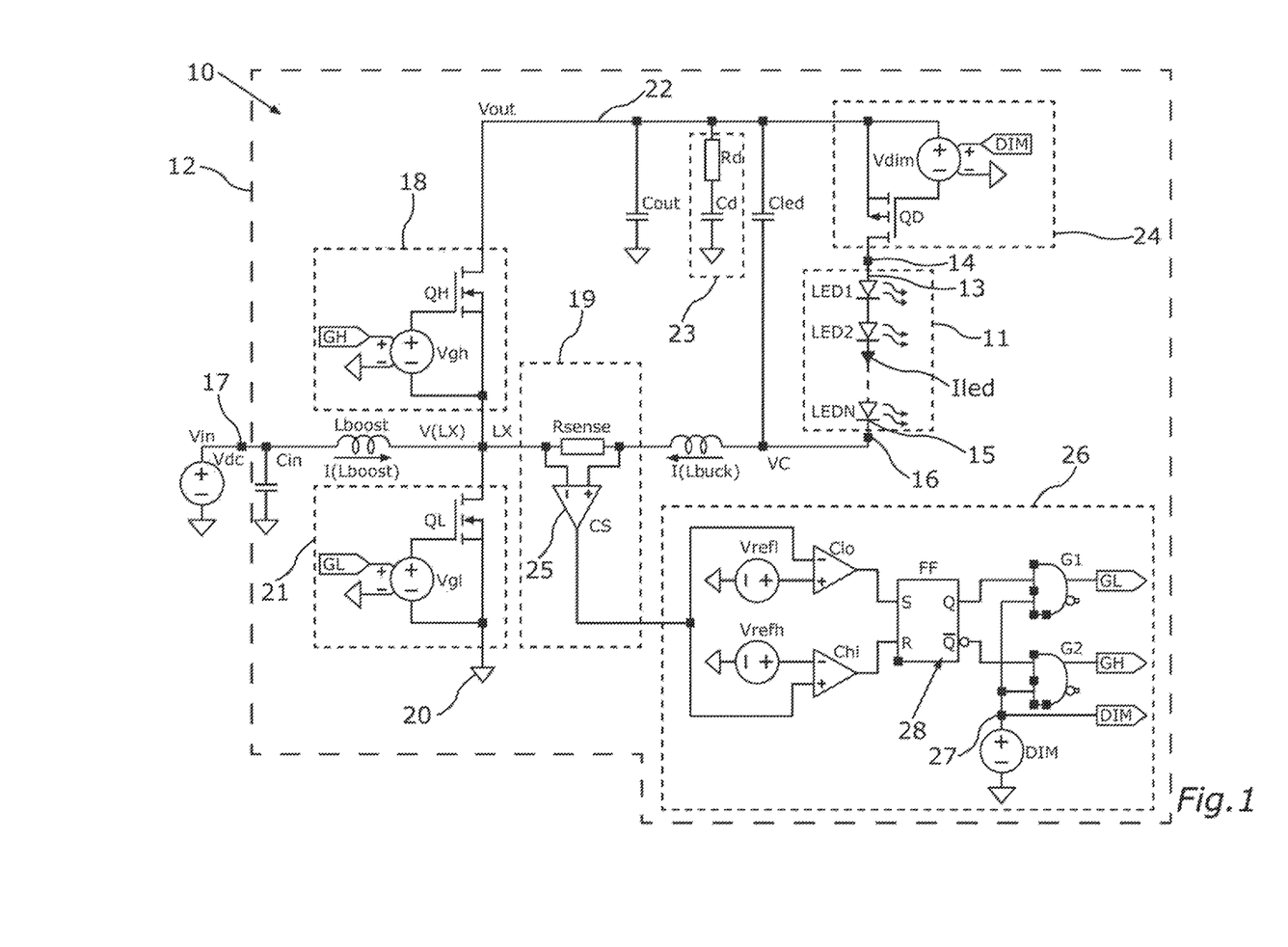
FIG. 1 shows a schematic illustration of an embodiment of the driver circuit according to the invention.

Referring now to the figures of the drawing in detail and first, particularly, to FIG. 1 thereof, there is shown a driver circuit 10 to which a light-emitting diode arrangement 11 can be connected. The light-emitting diode arrangement 11 illustrated here is a series circuit composed of light-emitting diodes LED1 to LEDN (LED—light-emitting diode), wherein N is the number of light-emitting diodes. The variable N may have a value of 2 to, say, 40. A single light-emitting diode is also possible. The driver circuit 10, together with the light-emitting diode arrangement 11, forms a lighting apparatus 12. The lighting apparatus 12 can be installed in a motor vehicle or in a building, for example.

The light-emitting diode arrangement 11 is connected with an anode side 13 to an anode terminal 14. The light-emitting diode arrangement 11 is connected with a cathode side 15 to a cathode terminal 16. A diode current Iled can flow from the anode terminal 14 to the cathode terminal 16, wherein a current intensity of the diode current Iled is controlled by the driver circuit 10.

A voltage source Vdc is connected to a supply terminal 17 of the driver circuit 10, which voltage source is represented here only symbolically. An input voltage Vin received from the voltage source Vdc may be smoothed by means of an input capacitance Cin.

In the driver circuit 10, the supply terminal 17 is connected to a circuit node LX by way of a boost converter inductance Lboost. The anode terminal 14 is connected to the circuit node LX by way of a rectifying unit 18. The cathode terminal 16 is connected to the circuit node LX by way of a buck converter inductance Lbuck and a current measurement unit 19. The inductances Lboost, Lbuck can each be formed by an inductor or coil.

The circuit node LX can be interconnected with a ground potential 20 by way of a switching unit 21. The ground potential 20 is also symbolized in the figures by a triangle, for which reason the reference numeral 20 is not given at each symbol.

A storage capacitance Cout and an RC element 23 are connected to a circuit branch 22 that connects the rectifying unit 18 to the anode terminal 14. The RC element 23 can have a resistance element Rd and a capacitance Cd. The storage capacitance Cout and the RC element 23 are connected to ground potential 20. A smoothing capacitance Cled is connected between the anode terminal 14 and the cathode terminal 16. The capacitances Cout, Cd, Cled can each be provided by a capacitor.

A dimming switching unit 24 is connected upstream of the anode terminal 14. The dimming switching unit 24 includes a switch QD, which can switch the diode current Iled depending on a dimming signal DIM. The switch QD can be formed on the basis of a transistor, in particular a field-effect transistor (FET). A gate voltage Vdim can be specified at a gate of the transistor by the dimming signal QD. The corresponding electrical components are only symbolically represented by a voltage source. The dimming signal QD can also provide the gate voltage Vdim directly.

A voltage potential with respect to the ground potential 20 in the circuit branch 22 is referred to as Vout. A voltage potential with respect to the ground potential 20 at the cathode terminal 16 is referred to as Vc. A voltage potential with respect to the ground potential 20 at the circuit node LX is referred to as V(LX).

The current measurement unit 19 includes a shunt resistor Rsense, which can be connected between the buck converter inductance Lbuck and the circuit node LX. The buck converter inductance Lbuck and the shunt resistor Rsense can also be interconnected in reverse order. A voltage, which is provided by way of a measurement amplifier 25 as a measurement signal CS, is dropped across the shunt resistor Rsense depending on a current I(Lbuck) through the buck converter inductance Lbuck. The measurement amplifier 25 here is an operational amplifier. The voltage dropped can also directly form the measurement signal CS.

The switching unit 21 is based on a switch QL. The switch QL can be a transistor, in particular an FET (field-effect transistor), preferably an N-channel FET. A switching signal GL specifies a gate voltage Vgl at a gate of the transistor QL. The corresponding electrical components are only symbolically represented by a voltage source. The switching signal GL can also provide the gate voltage Vgl directly.

The switching signal GL can be generated by a controller device 26 in dependence on the measurement signal CS. The controller device 26 can provide hysteretic control for this purpose. To this end, a comparator unit Clo and a comparator unit Chi can be provided, wherein an output of the comparator unit Clo can be connected to a set input S of a flip-flop unit FF and an output of the comparator unit Chi can be connected to a reset input R of the flip-flop unit FF. The comparator unit Clo can compare the measurement signal CS with a reference signal Vrefl and can signal at the output if the measurement signal CS is lower than the reference signal Vrefl. An output Q of the flip-flop unit FF is then set. The comparator unit Chi can compare the measurement signal CS with a reference signal Vrefh and can signal if the measurement signal CS is greater than the reference signal Vrefh. The output Q of the flip-flop unit FF is then reset. The signal at the output Q can be used as the switching signal GL. The electrical component parts for generating the reference signals Vrefl, Vrefh are only symbolically represented by voltage sources.

The dimming signal DIM can be received at a dimming terminal 27 by a signal source, which is represented in FIG. 1 by a voltage source. Said signal source can be an external signal source. The dimming signal DIM can be a pulse-width-modulated signal. In order to combine the dimming signal DIM with the signal of the output Q, a logic gate G1 for an AND link can be provided.

The flip-flop unit FF provides for an inverting device 28, which generates a signal that is inverted with respect to the signal at the output Q. The inverting device 28 is a logic gate.

In the embodiment shown in FIG. 1, the rectifying unit 18 is formed on the basis of a switch QH. The switch QH here is a transistor. A gate voltage Vgh of the transistor is specified by a rectifying signal GH, which is formed by the inverting device 28 as the inverse or inverted switching signal GL. The corresponding electrical components are only symbolically represented by a voltage source. The rectifying signal GH can also provide the gate voltage Vgh directly.

An actively switched, synchronous rectifier is thus produced. In order to take the dimming signal DIM into account here as well, the signal of the inverting device 28 can also be linked to the dimming signal DIM by way of a logic gate G2 by means of an AND link.

Figure 2:
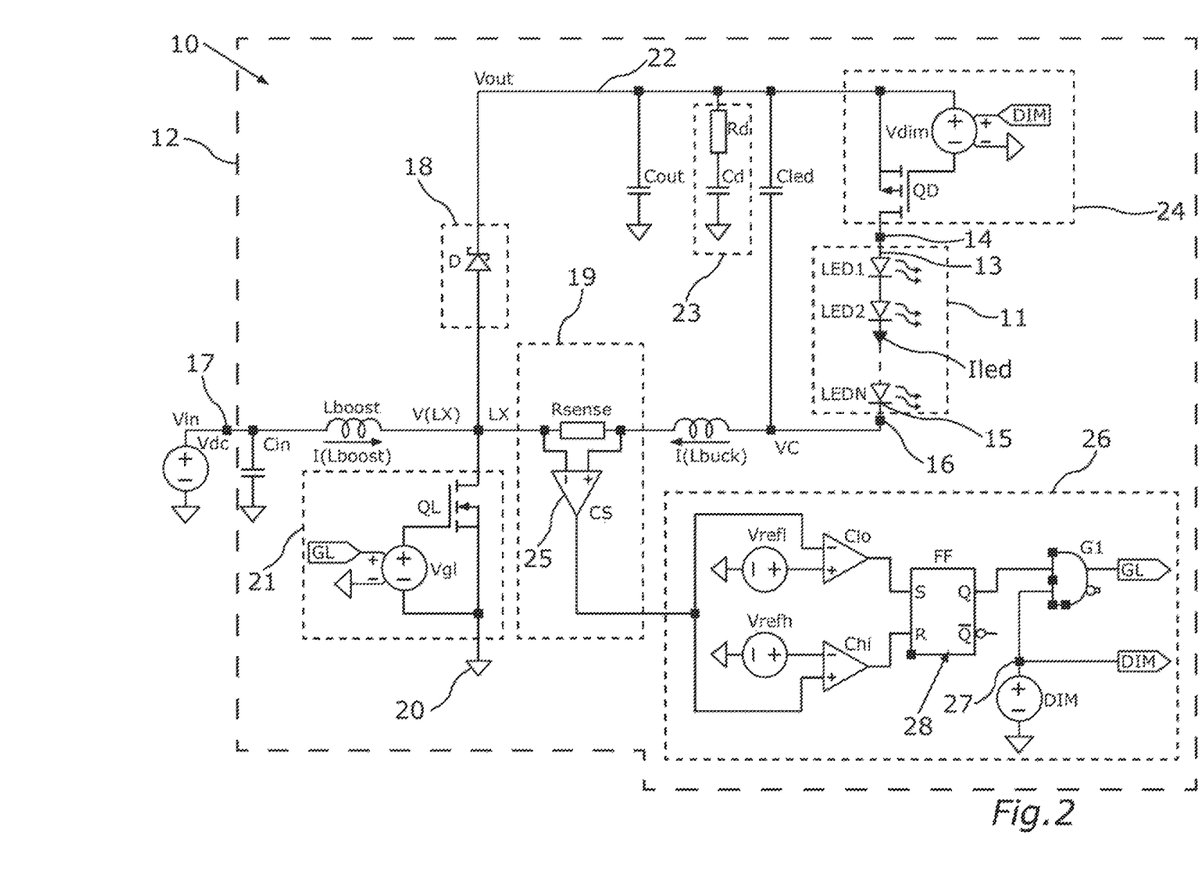
FIG. 2 shows a schematic illustration of a further embodiment of the driver circuit according to the invention.

FIG. 2 shows an embodiment in which the rectifying unit 18 has a diode D instead of a switch QH. A forward direction of the diode D leads from the circuit node LX to the anode terminal 14. The inverting output of the flip-flop unit FF can then remain unwired.

The functioning of the driver circuit 10 is described in the following text in accordance with the aforementioned embodiments.

The input voltage Vin, supported by the capacitor Cin, supplies power to the boost converter inductance Lboost, which, together with the active switch QL of the switching unit 21 and the synchronous rectifier QH (FIG. 1) or the diode D (FIG. 2) of the rectifying unit 18 and the capacitor Cout, forms a step-up/boost section (boost conversion).

The component parts Rd, Cd of the RC element 23 can be designed so that they damp a system of the second order, consisting of the reactive elements Cin, Lboost, Cout, to a specifiable degree. The component parts Lbuck, QL, the synchronous rectifier QH (FIG. 1) or the diode D (FIG. 2) and Cout form a step-down/buck section (buck conversion). This also includes the current measurement unit 19 comprising the shunt resistor Rsense and the optional measurement amplifier CS.

The optional dimming switch QD interrupts the current supply of the light-emitting diode arrangement 11 at the clock rate of the pulse-width modulation of the dimming signal DIM and thus makes very steep current edges of the diode current Iled possible for high contrast ratios.

Hysteretic control is used in the controller device 26, which hysteretic control allows the current I(Lbuck) in Lbuck to "jump" or oscillate always between a minimum value and a maximum value and thus on average adjusts a specifiable LED current intensity of the diode current Iled through LED1 . . . LEDN.

The comparator units Chi, Clo actuate a discrete logic block, comprising the flip-flop unit FF and the gates G1, G2.

If the switching unit 21 is electrically switched on by the switching signal GL (QL=on), this results in a switching phase "on". If the switching unit is electrically switched off by the switching signal GL (QL=off), this results in a switching phase "off".

Figure 3:
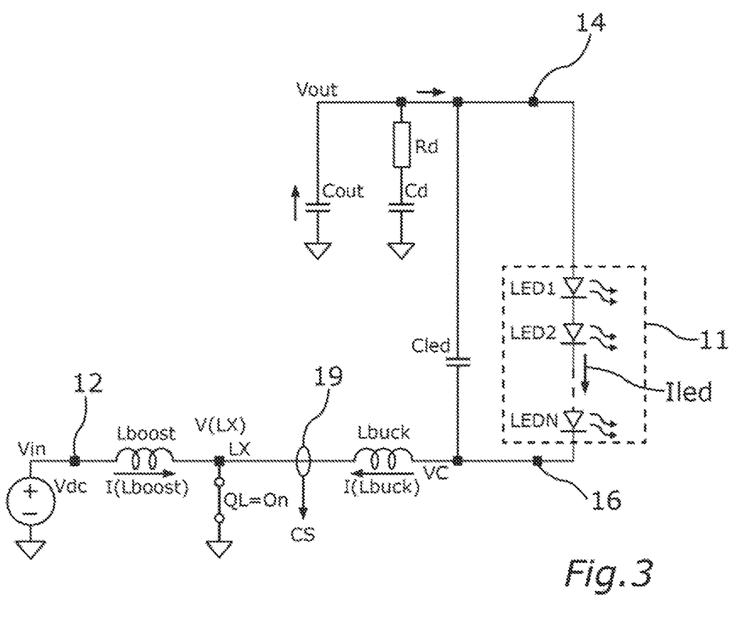
FIG. 3 shows an equivalent circuit diagram for illustrating a first switching phase of the driver circuit.
Figure 4:
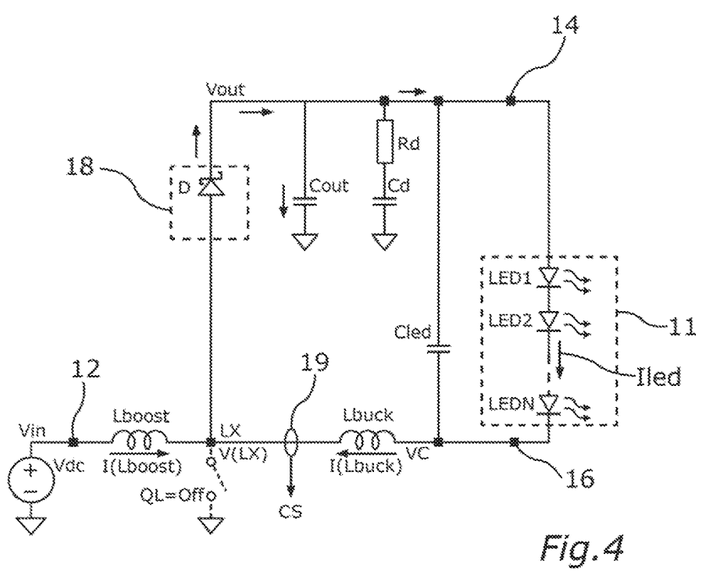
FIG. 4 shows an equivalent circuit diagram for illustrating a second switching phase of the driver circuit.
Figure 5:
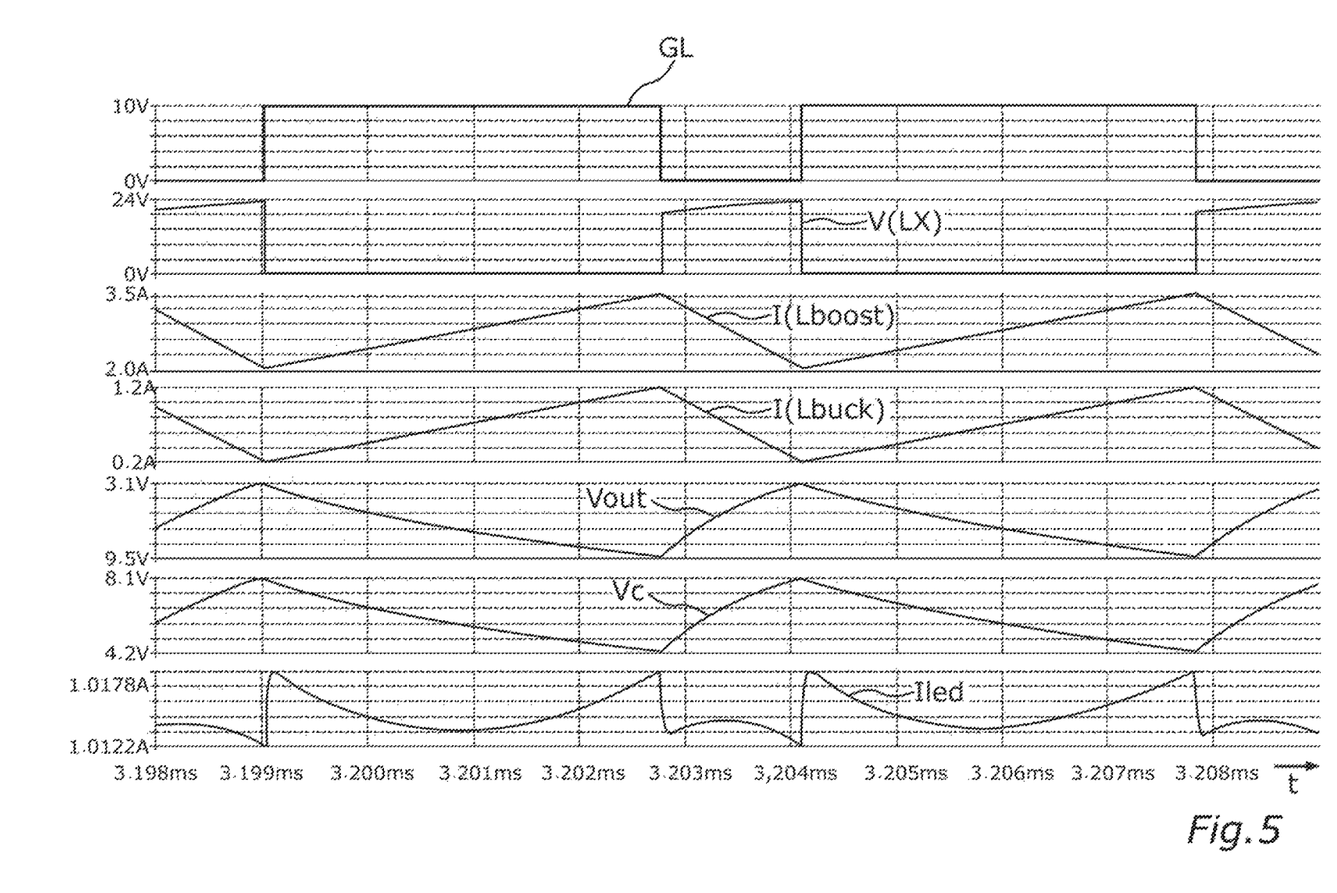
FIG. 5 shows a graph with schematized time profiles of electrical variables of the driver circuit.

FIG. 3 shows an equivalent circuit diagram for the on phase. FIG. 4 shows an equivalent circuit diagram for the off phase. FIG. 5 illustrates current and voltage profiles over time t in an exemplary case with a light-emitting diode arrangement 11 comprising N=4 light-emitting diodes in series, Vin=6 V supply voltage and a specified LED diode current Iled=1 A for illustrative purposes.

Consideration of the equivalent circuit diagrams of the driver circuit 10 for each switching phase of the active switch QL discloses the functioning. In the "on phase," energy is stored in the boost converter inductance Lboost. At the same time, the buck converter inductance Lbuck is charged by the energy in the capacitor Cout by means of the light-emitting diodes LED1 . . . LEDN. The hysteretic controller device 26 monitors the maximum current value of the current I(Lbuck) in the buck converter inductance Lbuck by means of the current measurement unit 19 and terminates the on phase as soon as the maximum value specified by Vrefh is reached.

In the subsequent "off phase", the two inductances Lboost, Lbuck are discharged and the energy stored in them charges the capacitor Cout. The current flows further through the light-emitting diodes LED1 . . . LEDN, but decreases. The hysteretic controller device 26 monitors the minimum current value of the current I(Lbuck) in the buck converter inductance Lbuck and terminates the off phase as soon as the minimum value specified by Vrefl is reached. The on phase then begins again.

By suitable selection of the values of the inductances Lboost, Lbuck and of the hysteresis thresholds (reference signals Vrefl, Vrefh for the two comparator units Chi, Clo), the switching frequency range and/or functional range of the driver circuit 10 can be set and can be matched to the input voltage range of the input voltage Vin and the LED chain length N of the light-emitting diode arrangement 11.

Figure 6:
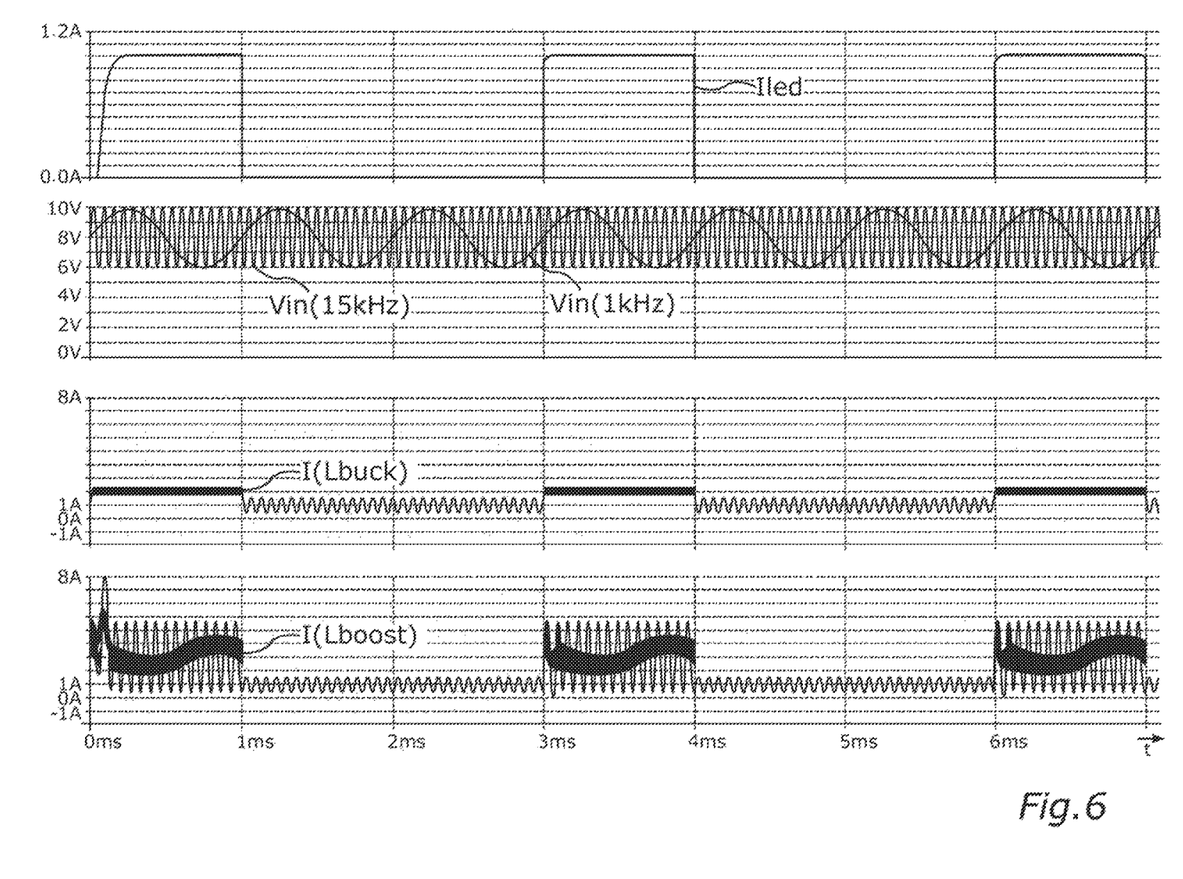
FIG. 6 shows a graph with further schematized profiles of electrical variables of the driver circuit (8 V case)
Figure 7:
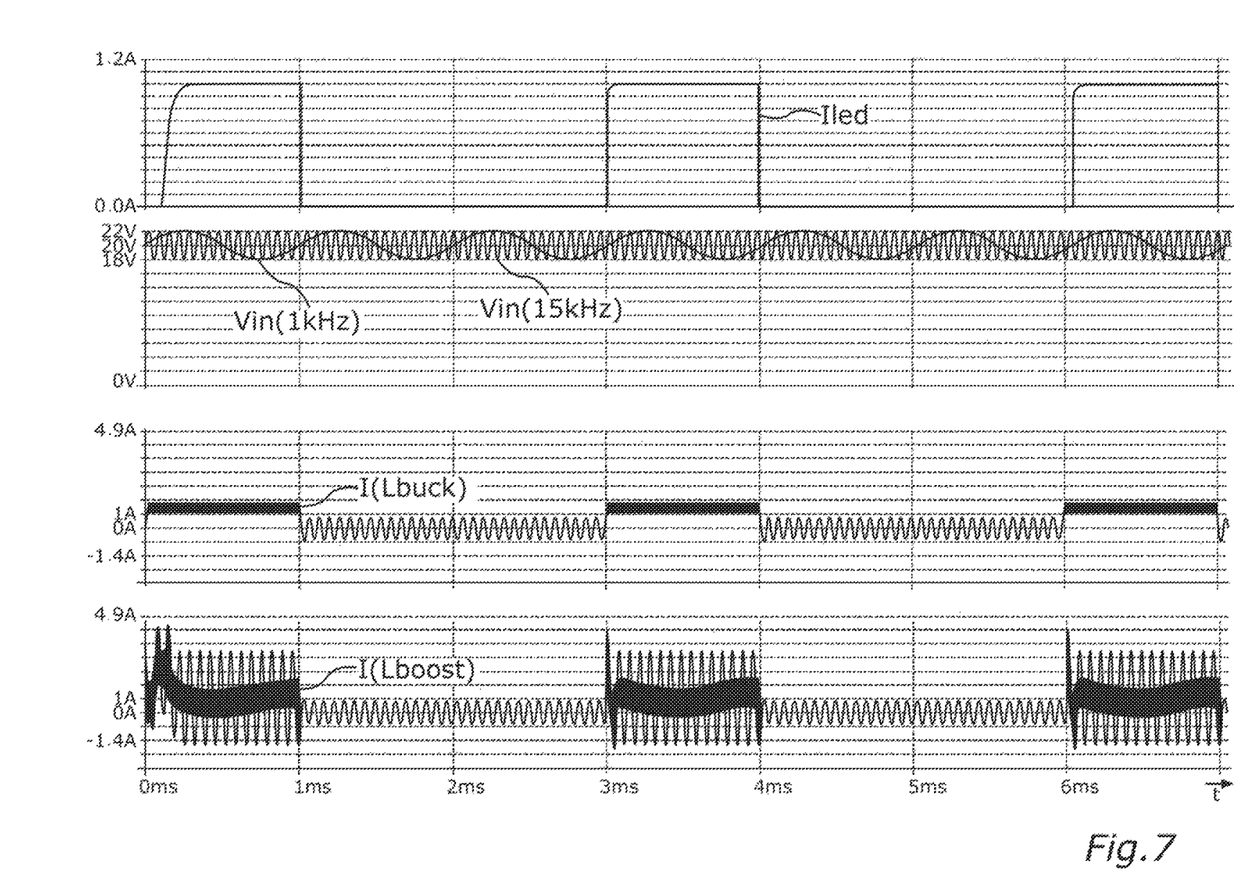
FIG. 7 shows a graph with further schematized profiles of electrical variables of the driver circuit (20 V case)

In order to illustrate typical operating conditions, FIG. 6 simulates an example with an input voltage of Vin=8 V and FIG. 7 illustrates an example with an input voltage of Vin=20 V, each in the case of a superposed sinusoidal voltage with 2 V pp amplitude (pp amplitude—peak-to-peak amplitude) and two possible frequencies of 1 kHz and 15 kHz. This corresponds, for example, to a standardized automotive test. At the same time, a pulse-width-modulated dimming voltage DIM is also applied in order to switch the light-emitting diodes of the light-emitting diode arrangement 11 on and off periodically. The sudden-load-variation response of the lighting apparatus 12 is thus also examined for possible control weaknesses (which would manifest themselves as current surges or overshoots).

The simulation with typical component values illustrates the excellent performance (with respect to "line regulation" and "load regulation") of the hysteretic buck-boost LED driver realized by the driver apparatus 10. The LED diode current Iled always remains corrected, even in the case of input voltage fluctuations and sudden changes in load.

Figure 8:
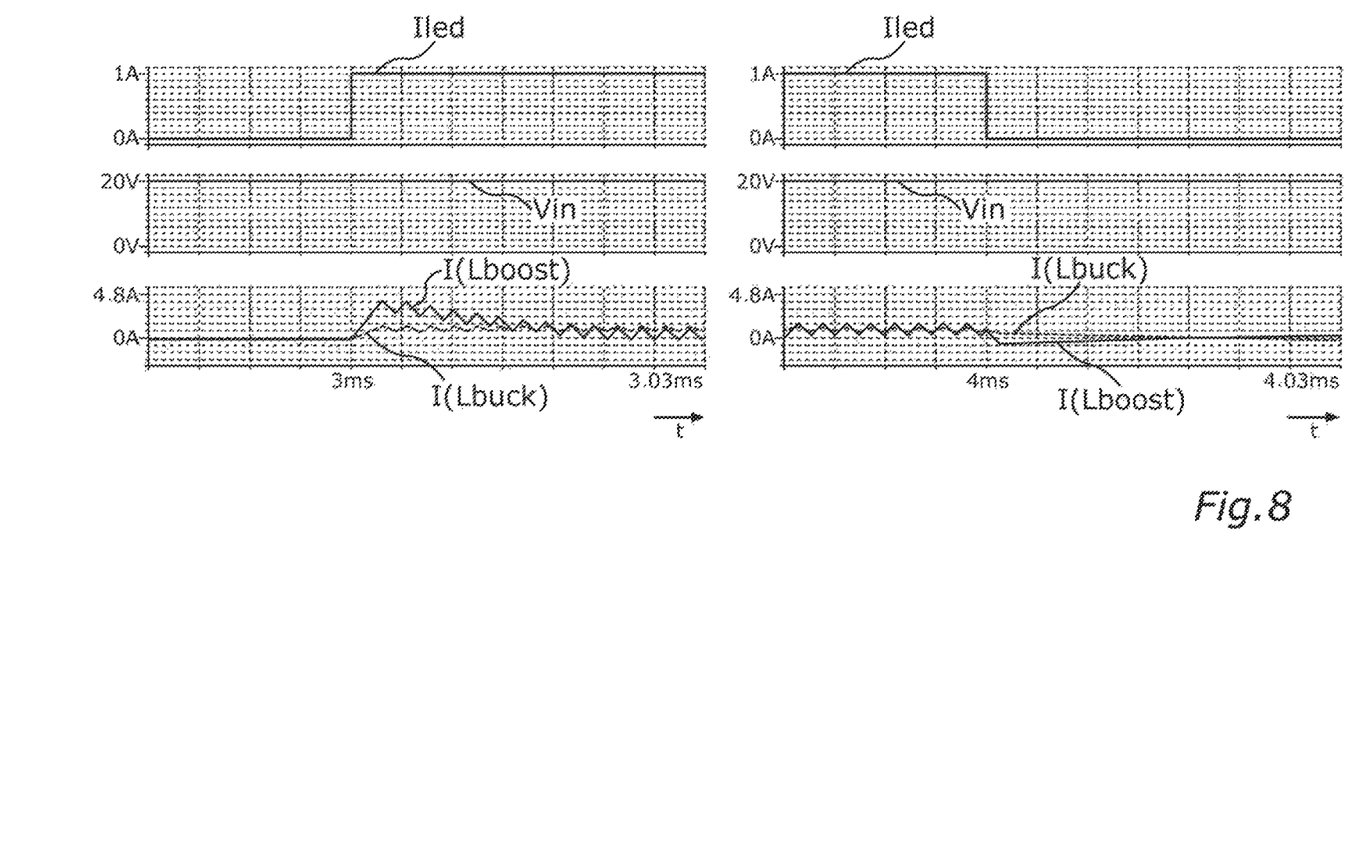
FIG. 8 shows two graphs with an enlargement of time profiles.

To this end, FIG. 8 and FIG. 9 once again illustrate enlarged sections of the profiles of FIG. 7. The control bandwidth is high because it is clear that even 15 kHz sine sweeps (illustrated as time profiles with the addition of "15 kHz") have no effect on the LED diode current Iled.

Figure 9:
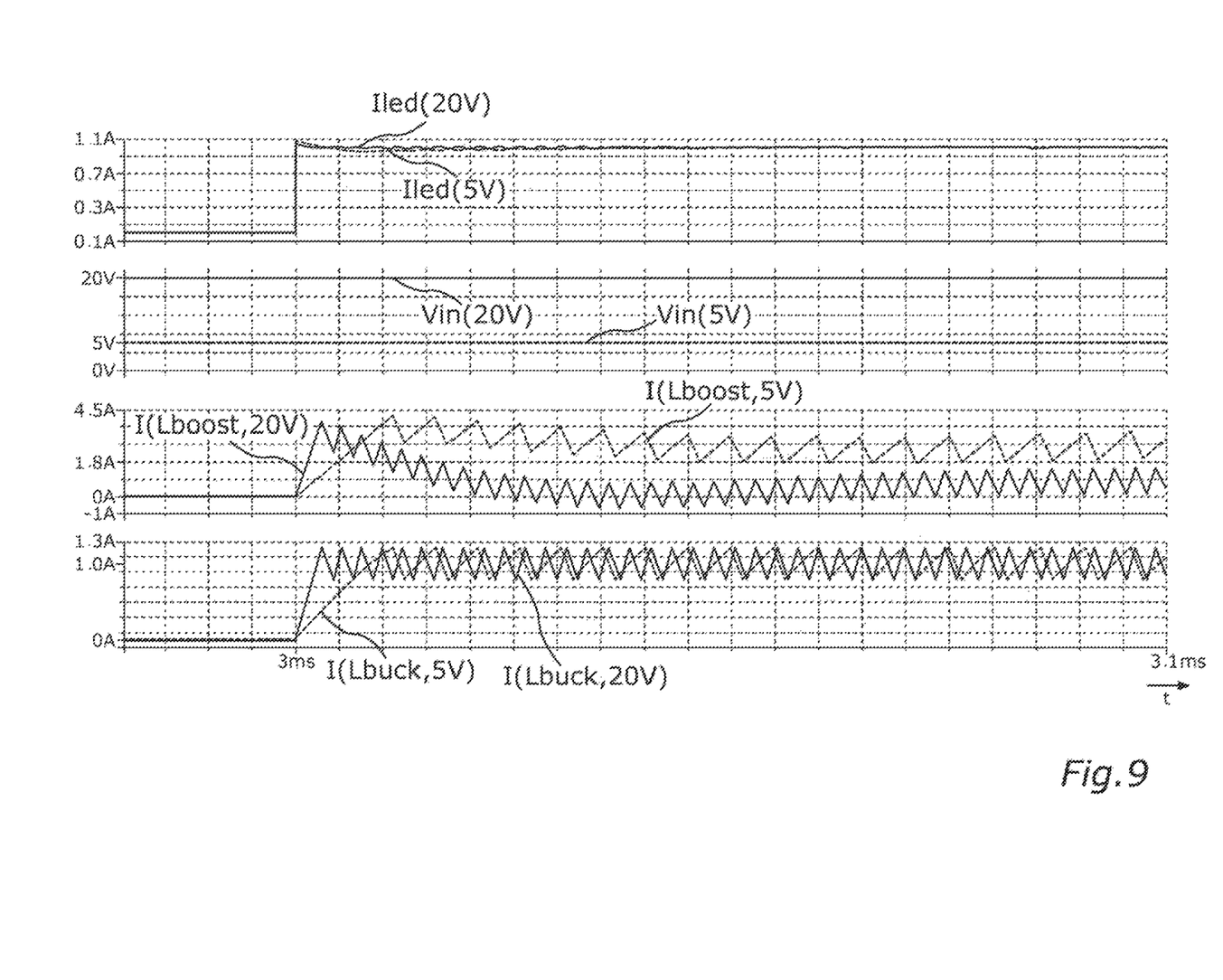
FIG. 9 shows a further graph with an enlargement of time profiles.

FIG. 9 shows a sudden change in load for the different input voltages Vin=20 V and Vin=5 V. It is shown that the specified diode current Iled=1 A can always be adjusted in less than 10 µs. In the case of Vin=20 V, a greater switching frequency of the switching signal GL results in comparison to Vin=5 V.

The driver circuit 10 thus provides a buck-boost topology, which can be realized in a cost-effective manner, since only one semiconductor switch QL is required. The hysteretic control in combination with a buck-boost LED driver, which manages quickly and simply and without the high-side current measurement at the drain node that is required for an otherwise conventional slope compensation, is advantageous. The illustrated position of the current measurement offers advantages in the case of an integrated embodiment of the controller. The variable switching frequency (it is lower at high loads) can minimize the switching losses. The dimming function by means of the PWM signal also permits the use of an external dimmer switch and steep LED current edges can be produced.

The invention thus provides for a hysteretic LED driver with a buck-boost topology.

The following is a summary list of reference numerals and the corresponding structure used in the above description of the invention:

10 Driver circuit
11 Light-emitting diode arrangement
12 Lighting apparatus
13 Anode side
14 Anode terminal
15 Cathode side
16 Cathode terminal
17 Supply terminal
18 Rectifying unit
19 Current measurement unit
20 Ground potential
21 Switching unit
22 Circuit branch
23 RC element
24 Dimming switching unit
25 Measurement amplifier
26 Controller device
27 Dimming terminal
28 Inverting device
Chi Comparator unit
Clo Comparator unit
CS Measurement signal
DIM Dimming signal
FF Flip-flop unit
G1 Gate
G2 Gate GH Rectifying signal
GL Switching signal
Iled Diode current
I(Lbuck) Current
I(Lboost) Current
Lbuck Buck converter inductance
Lboost Boost converter inductance
LX Circuit node
Q Output
QH Switch
QL Switch
Vin Input voltage
Vgh Gate voltage
Vgl Gate voltage
Vout Voltage potential
Vrefl Reference signal
Vrefh Reference signal
V(LX) Voltage potential

The invention claimed is:

1. A driver circuit for a light-emitting diode arrangement, the driver circuit comprising:
a supply terminal for connecting a voltage source;
a boost converter inductance connecting said supply terminal to a common circuit node;
a switching unit configured to connect said common circuit node to a ground potential depending on a switching signal;
an anode terminal for connection of an anode side of the light-emitting diode arrangement;
a rectifying unit connecting said common circuit node to said anode terminal, said rectifying unit being connected to said anode terminal by way of a circuit branch to which a terminal of a storage capacitance and a terminal of an RC element are connected;
a cathode terminal for connecting to a cathode side of the light-emitting diode arrangement, said cathode terminal being electrically connected to said common circuit node;
a buck converter inductance connected between said rectifying unit and said anode terminal and/or between said cathode terminal and said common circuit node; and
a hysteretic controller device for generating the switching signal, wherein said hysteretic controller device is configured to keep a current intensity of an electric current flowing from said cathode terminal to said common circuit node between a predetermined minimum value and a predetermined maximum value by switching said switching unit with the switching signal.

2. The driver circuit according to claim 1, wherein said cathode terminal is connected to the ground potential only by way of said common circuit node and said switching unit.

3. The driver circuit according to claim 1, which comprises a smoothing capacitance connected between said anode terminal and said cathode terminal.

4. The driver circuit according to claim 1, which comprises a current measurement unit for generating a measurement signal correlated with the current intensity, said current measurement unit connecting said cathode terminal with said common circuit node.

5. The driver circuit according to claim 4, wherein said current measurement unit includes a shunt resistor, and said cathode terminal is electrically connected to said common circuit node by way of said shunt resistor of said current measurement unit.

6. The driver circuit according to claim 4, which comprises:
a first comparator unit configured to compare the measurement signal with a first reference signal and to signal a result of the comparison as a first comparison signal;
a second comparator unit configured to compare the measurement signal with a second reference signal and to signal a result of the comparison by second comparator unit as a second comparison signal;
a flip-flop unit having a set input and a reset input configured to respectively receive one of the first and second comparison signals; and
wherein said controller device is configured to generate the switching signal from an output signal of said flip-flop unit.

7. The driver circuit according to claim 1, wherein said rectifying unit comprises at least one diode or a rectifying switching unit.

8. The driver circuit according to claim 7, wherein said rectifying switching unit is an inverting device configured to switch said rectifying switching unit inversely to said switching unit.

9. The driver circuit according to claim 1, which comprises a dimming terminal for receiving a dimming signal and a dimming switching unit connected upstream of said anode terminal or a dimming switching unit connected downstream of said cathode terminal, said dimming switching unit being configured to block a diode current flowing between said anode terminal and said cathode terminal in dependence on the dimming signal.

10. A lighting apparatus, comprising:
the driver circuit according to claim 1; and
the light-emitting diode arrangement;
the anode side of the light-emitting diode arrangement connected to the anode terminal of said driver circuit and the cathode side of the light-emitting diode arrangement connected to the cathode terminal of said driver circuit.

11. A motor vehicle, comprising:
a lighting apparatus with the driver circuit according to claim 1;
the light-emitting diode arrangement, wherein the light-emitting diode arrangement is connected to said driver circuit; and
a voltage source for providing an input voltage between the supply terminal and a ground terminal of said driver circuit of said lighting apparatus.

* * * * *